(12) United States Patent
Xu et al.

(10) Patent No.: US 9,331,299 B2
(45) Date of Patent: May 3, 2016

(54) EFFICIENT WHITE ORGANIC LIGHT EMITTING DIODES WITH HIGH COLOR QUALITY

(71) Applicant: Universal Display Corporation, Ewing, NJ (US)

(72) Inventors: Xin Xu, West Windsor, NJ (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/250,986

(22) Filed: Apr. 11, 2014

(65) Prior Publication Data

US 2015/0295198 A1    Oct. 15, 2015

(51) Int. Cl.
*H01L 51/50* (2006.01)
*H01L 51/00* (2006.01)

(52) U.S. Cl.
CPC ............ *H01L 51/504* (2013.01); *H01L 51/0071* (2013.01); *H01L 51/0072* (2013.01); *H01L 51/0074* (2013.01); *H01L 51/0085* (2013.01)

(58) Field of Classification Search
CPC .................................................. H01L 51/0545
USPC ........................................................... 257/40
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Mamadou Diallo
(74) *Attorney, Agent, or Firm* — Morris & Kamlay LLP

(57) ABSTRACT

Organic light emitting devices (OLEDs) are provided that include two red emissive dopants. The two dopants may be disposed within a common organic emissive layer in an OLED, or each may be disposed in a separate layer. Configurations including multiple layers having multiple dopants are also provided, in which a first red dopant is disposed in a separate organic layer from a second red dopant, and a common dopant of another color, such as green, is disposed in each organic layer. Devices as disclosed herein are capable of providing an R9 value of at least 80, and of providing white light with a CRI of at least 80.

20 Claims, 3 Drawing Sheets

(56) References Cited

U.S. PATENT DOCUMENTS

| | | |
|---|---|---|
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2005/0095451 A1* | 5/2005 | Begley et al. ............... 428/690 |
| 2005/0095453 A1* | 5/2005 | Begley et al. ............... 428/690 |
| 2005/0095454 A1* | 5/2005 | Ko et al. .................... 428/690 |
| 2010/0225252 A1 | 9/2010 | Weaver et al. |
| 2011/0233528 A1 | 9/2011 | Levermore et al. |
| 2011/0248294 A1 | 10/2011 | Weaver et al. |
| 2011/0309307 A1* | 12/2011 | Zeika et al. ................. 252/500 |
| 2012/0037896 A1* | 2/2012 | Kaiser ................. C09B 57/008 257/40 |
| 2012/0256938 A1 | 10/2012 | So |
| 2012/0319146 A1 | 12/2012 | Adamovich et al. |

OTHER PUBLICATIONS

Baldo et al.,"Very high-efficiency green organic light-emitting devices based on electrophosphorescence", Applied Physics Letters, vol. 75, No. 1, pp. 4-6, Jul. 5, 1999.

* cited by examiner

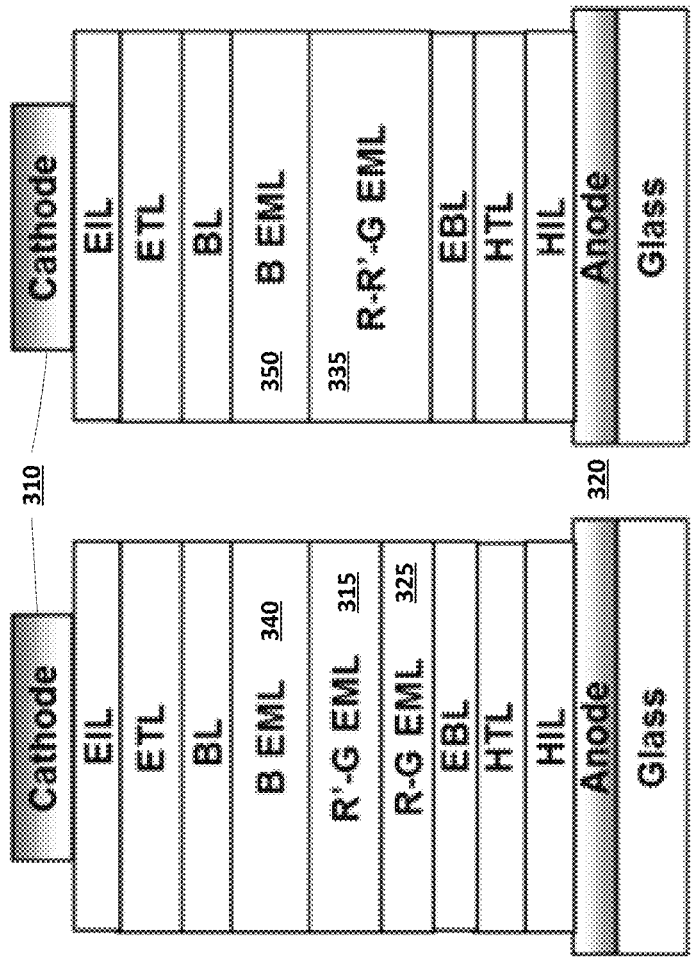
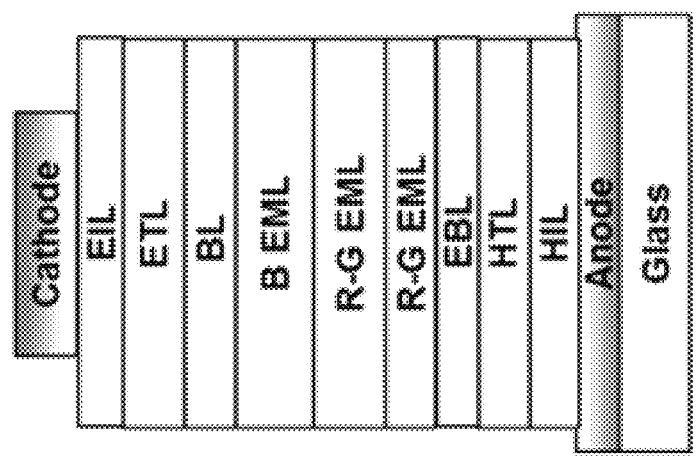
FIG. 3(a)     FIG. 3(b)     FIG. 3(c)

EFFICIENT WHITE ORGANIC LIGHT EMITTING DIODES WITH HIGH COLOR QUALITY

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, OLEDs having multiple emissive materials of similar color, and devices incorporating such OLEDs.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

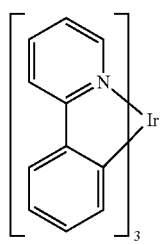

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Embodiments of the invention provide an organic light emitting device that includes an anode, a cathode, a first emissive dopant disposed between the anode and the cathode, having a peak wavelength of 600 to 700 nanometers; and a second emissive dopant disposed between the anode and the cathode, having a peak wavelength of 600 to 700 nanometers. The peak wavelength of the first emissive dopant is at least 4 nm less than the peak wavelength of the second emissive dopant, and the device is capable of emitting white light. The device may include a first emissive layer disposed between the anode and the cathode, where the first emissive dopant is disposed in the first emissive layer. The second emissive dopant may be disposed in the first emissive layer, or in a second emissive layer disposed between the anode and the cathode. Additional emissive layers and/or dopants may be disposed between the anode and the cathode, such as where additional dopants are provided in additional layers separate from one or more layers that include the first and second dopants. The first emissive dopant may have a peak wavelength of 600 to 635. Similarly, the second emissive dopant has a peak wavelength of 620 to 700. The device may have an R9 value of at least 80.

BRIEF DESCRIPTION OF THE DRAWINGS

FIG. 3(a) shows a schematic representation of a conventional OLED structure.

FIG. 3(b) shows a schematic representation of an OLED structure having two emissive layers with red dopants as disclosed herein.

FIG. 3(c) shows a schematic representation of an OLED structure having an emissive layer that includes two red dopants as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
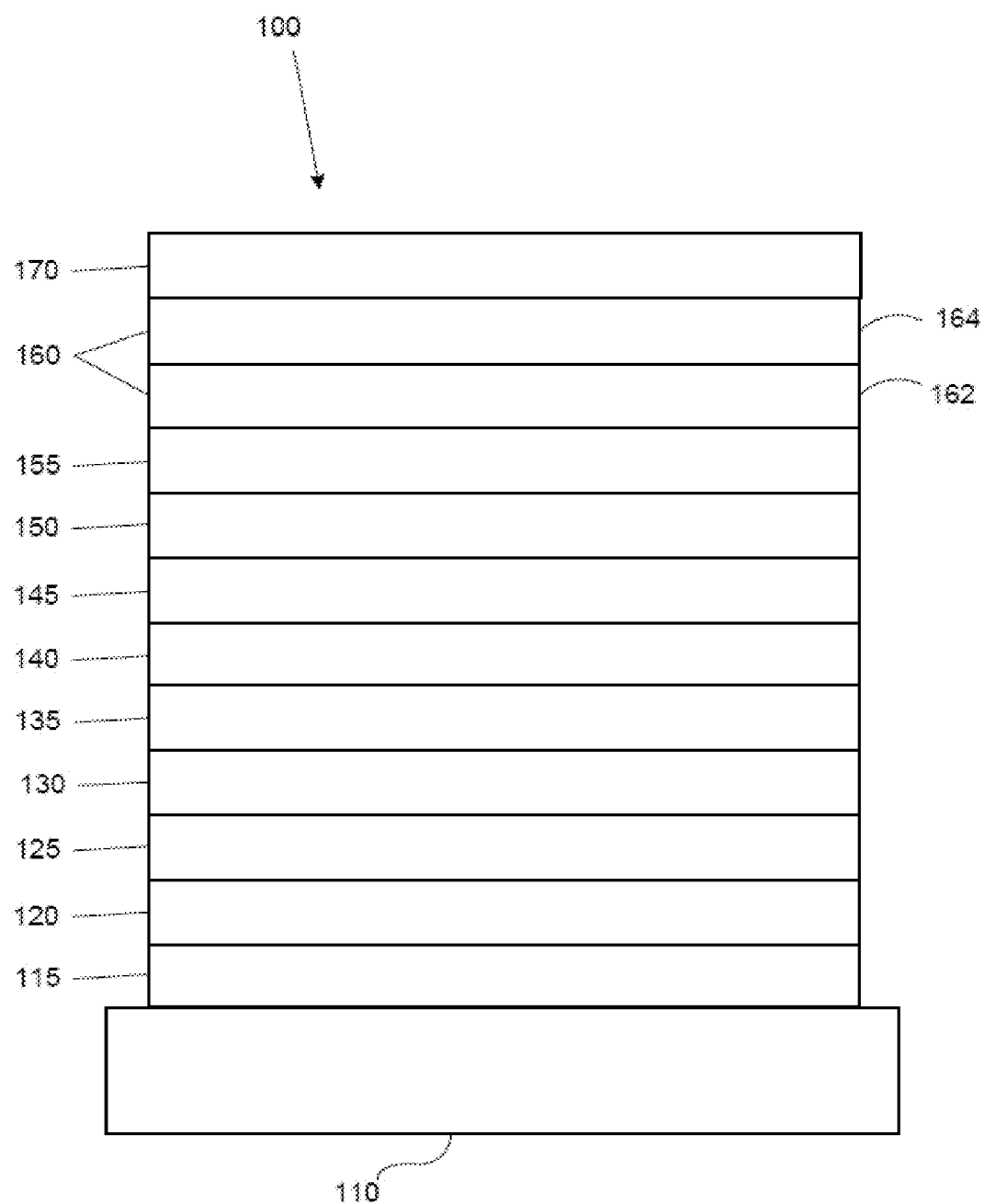
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
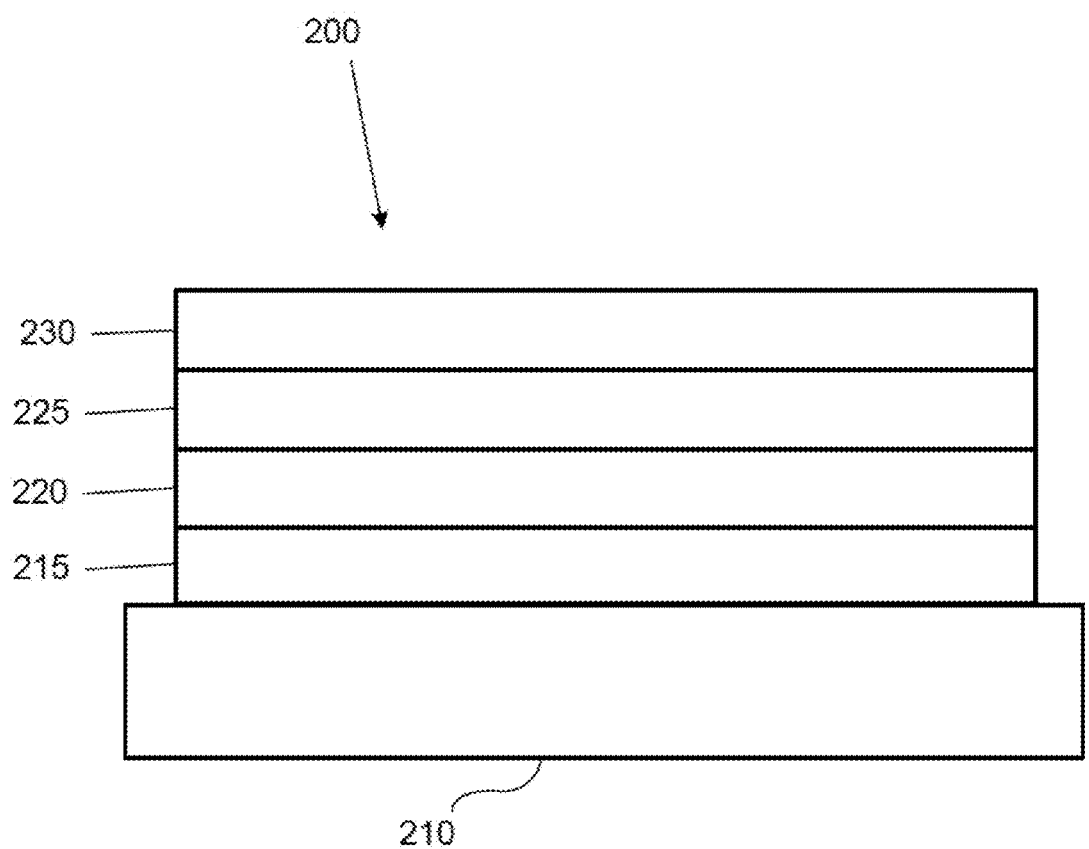
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In different applications, it may be desirable to use OLEDs having specific emissive color characteristics. For example, it may be desirable for OLEDs to be capable of providing white light, and/or light of a particular color. More specifically, it may be desirable for OLEDs to be capable of providing a specific minimum Color Rendering Index (CRI) values and/or specific colors, such as measured relative to standard colors in the General Color Rendering Test or similar standards.

As a specific example, In the CRI, the General Color Rendering Test is used to measure the color difference between a reference source and a source being tested. The Test uses color sample numbers R1-R8, and R9-R15 for calculations of the Special Color Rendering Indices. Specifically, R9 represents strong red. A light source with high R9 value, such as an R9 value of at least 80, may be desirable in many cases, such as food retailers, galleries, hospitals, and the like. In many cases, a light source with a CRI greater than 80 and an R9 value greater than zero is acceptable. However, when it is desirable for the red color to be more prominent, such as in hospitals, or when presentation of a specific color is desired, such as in galleries, museums and retailing industry, light sources with higher R9 values may desirable.

In the present disclosure, new "RRGB" architectures are provided that may incorporate a high-EQE (external quantum efficiency) red emitter to provide a relatively high efficiency, and a second deeper red emitter to provide improved color quality relative to conventional OLED architectures. Compared with a conventional RGB white OLED architecture, embodiments disclosed herein may provide significantly improved color quality, and specifically an improved R9 value of emitted light, while still being capable of providing high-quality white light.

FIG. 3(b) shows an example OLED as disclosed herein which has two green/red emissive layers, each of which has a different red emissive dopant. Similarly, FIG. 3(c) shows an example OLED as disclosed herein that includes one green/red/red emissive layer that incorporates two different red emissive dopants. For comparison, a conventional device is shown in FIG. 3(a), which includes red/green emissive layers with one deep red emissive dopant, and a blue emissive layer.

More generally, referring to FIGS. 3(b) and 3(c), embodiments disclosed herein provide OLEDs that include an anode 320, a cathode 310, and a first emissive dopant disposed between the anode and the cathode that has a peak wavelength of 600 to 700 nanometers. The emissive dopant may be provided in a single emissive layer 315, or it may be provided in a mixed layer such as the R—R'-G emissive layer 335. A second emissive dopant having a peak wavelength of 600 to 700 nanometers is also disposed between the anode and the cathode. The second dopant also may be provided in a layer with no other emissive dopants such as the layer 325 in FIG. 3(b), or in a mixed layer 335. Where one or more of the red emissive dopants is provided in a mixed layer 335, the layer may contain both red emissive dopants, and/or additional dopants, such as where a green dopant is included in the layer 335 as shown in FIG. 3(c). More generally, devices disclosed herein may include a first emissive layer disposed between the anode 320 and the cathode 310, which may include one or both of the red dopants. Where the first emissive layer includes one red dopant, a second emissive layer disposed over the first emissive layer, may include the second red dopant. Other dopants may be included in either the first emissive layer or the second emissive layer, regardless of whether the red dopants are included in a single layer or are disposed within two separate emissive layers. For example, FIG. 3(c) shows a configuration in which the two red dopants are disposed within a single emissive layer 335 and the device includes a separate blue emissive layer 350. In configurations in which each red dopant is disposed within a separate emissive layer, a third emissive layer disposed between the anode and cathode may include other dopants. For example, FIG. 3(b) shows a configuration that includes a blue third emissive layer 340, and emissive layers 315, 325 that each include a red dopant and a common green dopant.

The two red dopants may have a peak wavelength that differs by at least 4 nm. For example, the first emissive dopant may have a peak wavelength that is at least 4 nm less than the peak wavelength of the second emissive dopant. In some cases, the two red dopants may have peak emissive wavelengths in different regions of the red visible spectrum. For example, the first emissive dopant may have a peak wavelength in the range of 600 to 635 nm, and the second in the range of 620 to 700 nm. Such configurations may be desirable to provide high-quality red from the device as a whole.

As previously described, devices disclosed herein may be configured to emit white light, for example, having a CRI of 80 or above, as well as light of any other desired color, by using combinations of red, green, blue, and/or yellow emissive layers, as will be readily understood by one of skill in the art. Notably, devices disclosed herein may provide a higher-quality red due to the use of two red emissive dopants. More specifically, a device as disclosed herein may be capable of emitting red light having an R9 value as measured of at least 80 as measured by the CRI General Color Rendering Test.

In general, any suitable material may be used as the dopants disclosed herein. For example, one or more dopants may be a fluorescent or phosphorescent dopant. Similarly, any suitable emission principles may be implemented by the dopants and devices disclosed herein, including delayed fluorescence, thermally activated delayed fluorescence, upconversion, downconversion, and the like.

Experimental

Two white OLEDs as shown in FIGS. 3(b) and 3(c) were fabricated in high vacuum (i.e., at least $10^{-7}$ Torr) by thermal evaporation. The anode electrode included 1200 Å of indium tin oxide (ITO), and the cathode included 10 Å of Liq as electron injection layer (EIL) followed by 1,000 Å of Al. All devices were encapsulated with a glass lid sealed with an epoxy resin in a nitrogen glove box <1 ppm of $O_2$ and $H_2O$,) immediately after fabrication, and a moisture getter was incorporated inside the package. Both device examples had organic stacks including, sequentially from the ITO surface, 100 Å LG101 (purchased from LG Chemical) as the hole injection layer (HIL), 400 Å of Compound A as the hole transporting layer (HTL), 50 Å of Compound B as the electron blocking layer (EBL), one or two co-doped green/red emissive layers, such as shown in FIG. 3(b), 75 Å of Blue emissive layer (EML) with Compound C as host and Compound D as blue emitter, followed by 50 Å Compound E as the hole blocking layer and 450 Å Liq:LG201 (purchased from LG Chemical) as the electron transporting layers (ETL).

For comparison, a common green/red layer was grown using Compound F as a deep red emitter between reference device A and target device B. In reference device A, the second green/red layer is composed of the same deep red emitter Compound F and Compound G as the host and Compound H as the green emitter. In target device B, the second green/red layer is composed of a less deep but more efficient red emitter Compound I with same host system. Therefore, in general, the reference device A provides a standard structure with one red emitter, and the target device B is a red/red/green/blue (RRGB) architecture that contains two red emitters as disclosed herein. As previously described, the two red emitters can be included in a single EML such as shown in FIG. 3(c), as well as in separate two EMLs.

As for comparison, the device data of reference device A and target device B are listed in Table 1:

TABLE 1

|   | 1931 CIE | | 10 mA/cm2 | | | | At 1000 nits | | |
|---|---|---|---|---|---|---|---|---|---|
|   | x | y | R9 | CRI | CCT | duv | Voltage [V] | LE [cd/A] | EQE [%] | PE [lm/W] |
| A | 0.458 | 0.421 | 64 | 83 | 2,808 | 0.004 | 4.2 | 43 | 25 | 32 |
| B | 0.466 | 0.421 | 96 | 87 | 2,691 | 0.003 | 4.3 | 46 | 25 | 34 |

The two white OLED devices both emit warm white colors (CCT=2,700K~2,800K) that meet Energy Star criteria with duv<0.007 and CRI>80. The difference in CRI between two devices is minimal since CRI only measures color rendition using 8 less-saturated pigment colors. However, it was found that the four-component RRGB device provides a much higher R9 value. Although the reference device has a relatively acceptable R9 value of 64, this is due to the deep red phosphorescent emitter that is applied in the device. Further, with the new device architecture containing two red emitters, the R9 has been further enhanced to over 90.

The compounds used in fabricating the devices have the following structures:

Compound A

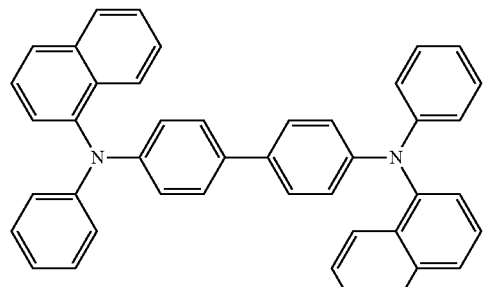

Compound B

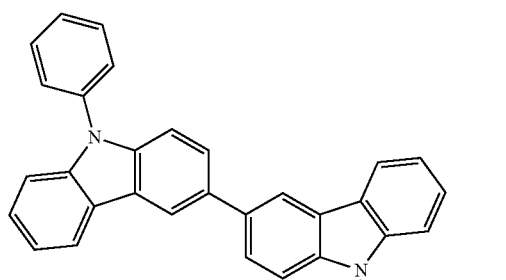

Compound C

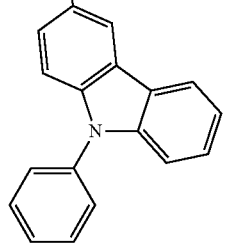

Compound D

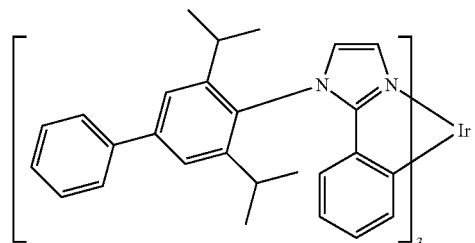

Compound E

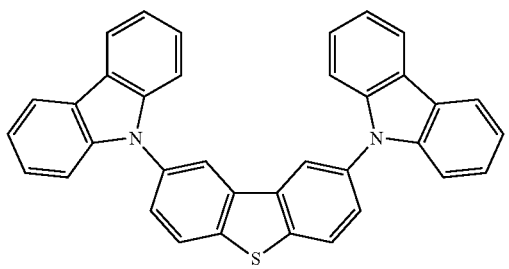

Compound F

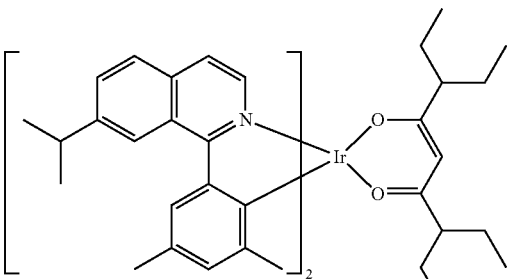

Compound G

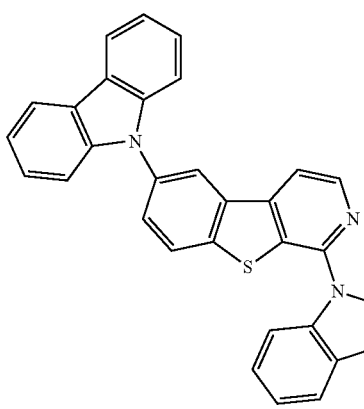

Compound H

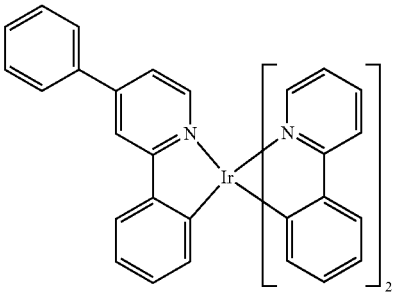

-continued

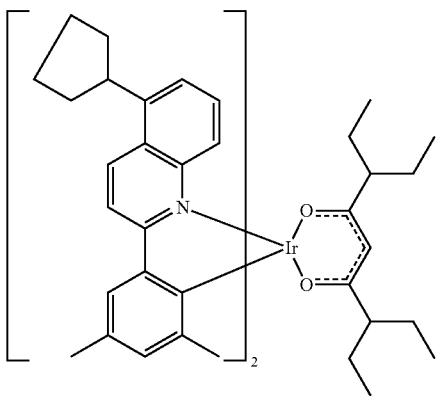

Compound I

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first organic light emitting device comprising:
an anode;
a cathode;
a first emissive dopant disposed between the anode and the cathode, having a peak wavelength of 600 to 700 nanometers; and
a second emissive dopant disposed between the anode and the cathode, having a peak wavelength of 600 to 700 nanometers,
wherein the peak wavelength of the first emissive dopant is at least 4 nm less than the peak wavelength of the second emissive dopant, and wherein the device emits white light.

2. The device of claim 1, wherein the device emits light having a CRI of 80 or above.

3. The device of claim 1, wherein the first emissive dopant has a peak wavelength of 600 to 635.

4. The device of claim 1, wherein the second emissive dopant has a peak wavelength of 620 to 700.

5. The device of claim 1, further comprising a first emissive layer disposed between the anode and the cathode, wherein the first emissive dopant is disposed in the first emissive layer.

6. The device of claim 5, wherein the second emissive dopant is disposed in the first emissive layer.

7. The device of claim 5, further comprising a second emissive layer disposed between the anode and the cathode, wherein the second emissive dopant is disposed in the second emissive layer.

8. The device of claim 7, wherein the second emissive layer is disposed over the first emissive layer.

9. The device of claim 1, wherein the first emissive dopant is disposed in the first organic layer.

10. The device of claim 1, wherein the device has an R9 value of at least 80.

11. The device of claim 1, wherein the first red emissive dopant comprises a phosphorescent emissive material.

12. The device of claim 1, wherein the first emissive dopant emits light via thermally delayed active fluorescence.

13. The device of claim 1, further comprising a third emissive dopant disposed Between the anode and the cathode.

14. The device of claim 13, wherein the third emissive dopant is disposed in a third organic layer disposed between the anode and the cathode.

15. The device of claim 14, further comprising a fourth emissive dopant disposed between the anode and the cathode.

16. The device of claim 15, wherein the fourth emissive dopant is disposed in an organic layer separate from an organic layer in which the first emissive dopant is disposed.

17. The device of claim 16, wherein the fourth emissive dopant is disposed in an organic layer separate from an organic layer in which the second emissive dopant is disposed.

18. The device of claim 17, wherein the first and second emissive dopants are disposed in a common organic layer.

19. The device of claim 13, wherein the first emissive dopant is disposed in a first organic layer disposed between the anode and the cathode.

20. The device of claim 19, wherein the second emissive dopant is disposed in a second organic layer disposed between the anode and the cathode.

* * * * *